(12) United States Patent
Gay et al.

(10) Patent No.: US 8,940,623 B2
(45) Date of Patent: Jan. 27, 2015

(54) PROCESS FOR OBTAINING AN ARRAY OF NANODOTS

(75) Inventors: Guillaume Gay, Grenoble (FR); Thierry Baron, Saint Egreve (FR); Eric Jalaguier, Saint Martin d'Uriage (FR)

(73) Assignees: Commissariat a l'Energie Atomique et aux Energies Alternatives, Paris (FR); CNRS-Centre National de la Recherche Scientifique, Paris (FR); Universite Joseph Fourier, Grenoble (FR)

( * ) Notice: Subject to any disclaimer, the term of this patent is extended or adjusted under 35 U.S.C. 154(b) by 379 days.

(21) Appl. No.: 13/370,759

(22) Filed: Feb. 10, 2012

(65) Prior Publication Data
US 2012/0217565 A1 Aug. 30, 2012

(30) Foreign Application Priority Data

Feb. 11, 2011 (FR) ..................................... 11 51127

(51) Int. Cl.
| H01L 21/20 | (2006.01) |
| H01L 21/28 | (2006.01) |
| H01L 21/308 | (2006.01) |
| H01L 29/423 | (2006.01) |
| H01L 29/788 | (2006.01) |

(52) U.S. Cl.
CPC ...... H01L 21/28273 (2013.01); H01L 21/3081 (2013.01); H01L 21/3086 (2013.01); H01L 29/42332 (2013.01); H01L 29/7881 (2013.01)
USPC ........... 438/478; 438/201; 438/211; 438/257; 257/315; 257/314; 257/317; 257/E21.09; 257/E21.19

(58) Field of Classification Search
CPC ............ H01L 21/3086; H01L 29/7881; H01L 29/42332; H01L 21/3081; H01L 21/28273
USPC ................ 257/315, 314, 317, E29.3, E21.19, 257/E21.09; 438/478, 201, 211, 257
See application file for complete search history.

(56) References Cited

U.S. PATENT DOCUMENTS 6,320,784 B1 * 11/2001 Muralidhar et al. .......... 365/151
2004/0256662 A1 12/2004 Black et al.
(Continued)

FOREIGN PATENT DOCUMENTS

| EP | 2 088 618 A1 | 8/2009 |
| EP | 2 381 471 A1 | 10/2011 |

OTHER PUBLICATIONS

French Preliminary Search Report and Written Opinion issued Dec. 16, 2011, in French 1151127, filed Feb. 11, 2011 (with English Translation of Categories of Cited Documents).

Primary Examiner — Thinh T Nguyen
(74) Attorney, Agent, or Firm — Oblon, Spivak, McClelland, Maier & Neustadt, L.L.P.

(57) ABSTRACT

A process for obtaining an array of nanodots (212) for microelectronic devices, characterized in that it comprises the following steps:
- deposition of a silicon layer (210) on a substrate (100, 132),
- formation, above the silicon layer (210), of a layer (240) of a material capable of self-organizing, in which at least one polymer substantially forms cylinders (242) organized into an array within a matrix (244),
- formation of patterns (243) in the layer (240) of a material capable of self-organizing by elimination of the said cylinders (242),
- formation of a hard mask (312) by transfer of the said patterns (243),
- production of silicon dots (212) in the silicon layer (210) by engraving through the hard mask (312),
- silicidation of the silicon dots (212), comprising deposition of a metal layer (510).

20 Claims, 5 Drawing Sheets

(56) References Cited

U.S. PATENT DOCUMENTS

Figure 1:
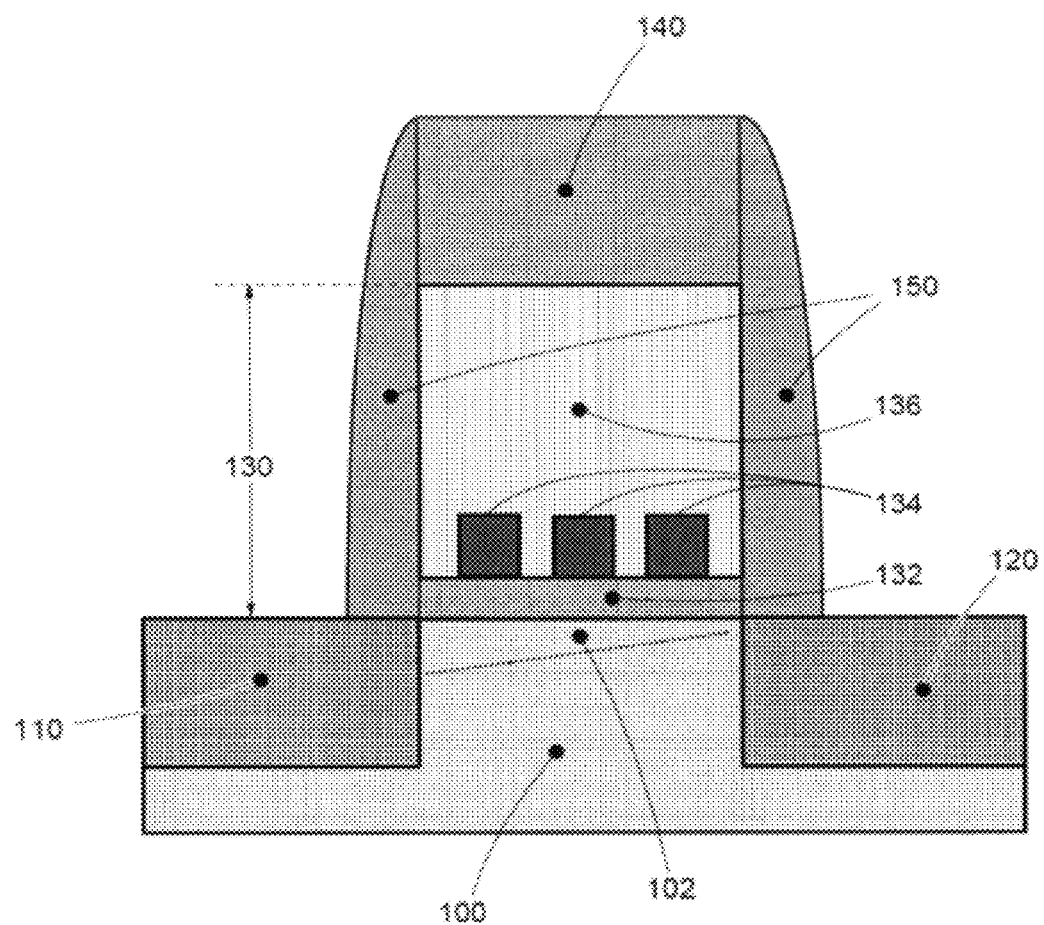

| | | |
|---|---|---|
| 2006/0163646 A1 | 7/2006 | Black et al. |
| 2007/0114572 A1 | 5/2007 | Seol et al. |
| 2009/0203205 A1 | 8/2009 | Molas et al. |
| 2009/0311851 A1 | 12/2009 | Black et al. |
| 2011/0129973 A1 | 6/2011 | Black et al. |
| 2011/0201182 A1 | 8/2011 | Black et al. |
| 2011/0300699 A1 | 12/2011 | Molas et al. |

* cited by examiner

PROCESS FOR OBTAINING AN ARRAY OF NANODOTS

TECHNICAL FIELD OF THE INVENTION

The present invention relates to the production of nanocrystals of metallic character, especially with a view to forming the floating gate of MOSFET transistors used by non-volatile memories of the EEPROM and FLASH types.

PRIOR ART

The constantly progressing miniaturization of devices produced by the microelectronics industry demands that it be possible to construct the basic components, essentially transistors, which from now on will be measured in tens of nanometers (nm=$10^{-9}$ meter). Consequently the limits of numerous techniques used by this industry, especially those of photolithography, are being reached. To be able to define progressively smaller patterns with very great precision at the surface of a semiconductor substrate, photolithography must implement increasingly more sophisticated means, such as, for example, the use of shorter wavelengths, into the ultraviolet, for exposure of photosensitive resins through masks reproducing the patterns, or exposure by immersion to reduce the problems of diffraction. Electron-beam lithography is also being employed for engraving patterns of nanometric size. However, this technique is intrinsically slow and costly, since each pattern of each device being produced must be exposed successively with an electron beam. By virtue of great precision, electron lithography is in practice most often reserved for production of the masks themselves.

However, for more than ten years, another approach toward forming patterns of small size has also been explored. An approach that does not need to rely on photolithography. It uses the property of certain materials of being able to self-organize if they are placed under appropriate conditions. They can then spontaneously produce a structure of nanometric patterns that can be used to transfer an array of corresponding patterns into the semiconductor device to be produced, without the need for those patterns to be defined by lithography or by any other external means other than by creation of environmental conditions propitious for their formation, especially compliance with the temperature and the duration of the operation that will permit the material to self-organize effectively.

This technique has been used in particular to construct the floating gate of MOSFET transistors, from the English: "Metal Oxide Semiconductor Field Effect Transistor", or in other words "field effect transistor of metal oxide semiconductor type", which are used to manufacture non-volatile memories of EEPROM type, from the English: "Electrically Erasable Programmable Read Only Memory", or in other words "programmable and electrically erasable read only memory". This type of memories includes in particular the so-called "FLASH" memories, which are enjoying very great success in particular in the form of USB keys, from the English "Universal Serial Bus", or in other words a universal data processing bus with serial transmission, by virtue of the very great integration density that they allow to be achieved as well as of the ease with which they can be rewritten a very great number of times while still being non-volatile, just as the hard disks of computers.

This very important property is obtained by the creation of a so-called floating gate included in the oxide of the metal oxide semiconductor structure of MOSFET transistors. The floating gate is then used to capture electrons that remain trapped there under normal memory reading conditions, and also in the absence of power supply, thus imparting the non-volatility. Thus, as a function of the fact that the floating gate of a transistor has or has not been permitted to trap a certain number of carriers, the electrical level of the conduction threshold of the MOSFET transistor will be higher or lower, thus permitting it to read at least two different conduction levels there as conductor or not conductor, and therefore to store at least one information bit there: 0 or 1.

The programming and erasure of a memory cell, or in other words the trapping of charges and evacuation thereof from the floating gate, relies on at least two techniques universally employed in this field: on the one hand, the injection of hot or in other words high-energy electrons to charge the floating gate; on the other hand, the tunnel effect, a quantum effect obtained by applying a high voltage to the metal control gate of the MOSFET transistor to reject, through the underlying thin oxide layer, generally referred to as tunnel layer, the electrons of the floating gate into the conduction channel between drain and source, from which they are evacuated. These conditions are obtained by applying particular voltages to the three electrodes of the transistors: source, drain and control gate. Voltage conditions that are obviously not present during reading, so as not to perturb the programming of the transistor being read.

Regardless of the techniques and means employed to read, program and erase a memory cell, and regardless of the architecture of their overall organization, which in particular has created the success of FLASH memories, a property common to memories using floating gate transistors is the capacity of being able to program more than two conduction levels. In other words, to be able to control the trapping of charges in the floating gate in reproducible and finer manner than simple programming of a single conduction threshold in the voltage range normally used in reading, so as, for example, to be able to discriminate four different levels and therefore to store two information bits therein: 00, 01, 10 and 11. Which has the effect, in this example, of being able to double the capacity of the corresponding memory without having to double the number of transistors. In the context of an industrial process, enlargement and reproducibility of the programming window for floating gates are essential factors in obtaining non-volatile memories, for example of FLASH type, of increasingly greater density.

Thus, to permit the construction of non-volatile memories of increasingly greater density and higher performance, it is understood that quite particular attention must be paid to the design of floating gates of MOSFET transistors used by these memories. Although the floating gates were traditionally constituted of a continuous layer, generally made of polycrystalline silicon, embedded in an insulating layer of silicon dioxide, the focus from now on will be placed on the construction of floating gates made of discrete trapping sites.

The construction of these discrete trapping sites is achieved in the form of dots of nanometric size or nanocrystals. As mentioned in the introduction, it is then particularly suitable to rely on the use of a material capable of self-organizing in order to define the size, typically some tens of nanometers, and the density of these sites that must be created over the entire surface of the gate of these MOSFET transistors.

In numerous applications, the performances of devices using these nanodots are closely related to the electrical behavior of the dots. It is therefore necessary to control the electrical behavior of the dots as precisely as possible.

In fact, uncontrolled electrical behavior of the dots leads, for example, to a reduction or to a displacement of the programming window of a memory cell comprising a MOSFET transistor whose gate comprises dots.

Furthermore, poor control of the electrical behavior often leads to poor reproducibility of the performances of devices integrating an array of nanodots.

The problem that the invention proposes to solve is therefore to improve control of the behavior of the dots of an array of nanodots.

The other objects, characteristics and advantages of the present invention will become apparent upon examination of the description hereinafter and of the attached drawings. It is understood that further advantages may be embodied.

SUMMARY OF THE INVENTION

The foregoing objectives are achieved by the invention, which describes a process for obtaining an array of nanodots for microelectronic devices, comprising the following steps:
  deposition of a silicon layer on a substrate,
  formation, above the silicon layer, of a layer of a material capable of self-organizing, in the interior of which at least one polymer substantially forms cylinders organized into an array within a matrix,
  formation of patterns in the layer of a material capable of self-organizing by elimination of the said cylinders,
  formation of a mask by transfer of the said patterns,
  obtaining of silicon dots in the silicon layer by engraving with the mask,
  silicidation of the silicon dots, comprising deposition of a metal layer.

In the context of development of the invention, it was found that the variability of the electrical behavior of devices using nanodots results from poor control of the evolution of these dots in the course of obtaining the device.

In particular, it turned out that the metallic dots used in the floating gates of transistors are indeed often degraded by the subsequent steps of finalization of the device, such as a transistor, in which these dots are integrated. These subsequent steps involve elevated temperatures, which may modify the electrical behavior and even the structure of certain dots. The invention provides for obtaining silicidated dots, which therefore are not exclusively metallic. It was found that their behavior is much less sensitive to temperature elevations than is that of purely metallic dots. The behavior of the dots obtained according to the invention therefore remains stable. The process according to the invention therefore makes it possible to improve control of the behavior of nanodots.

In addition, and in particularly advantageous manner, the process according to the invention makes it possible to improve, very significantly, the control in particular of the height of the dots compared with the known processes for obtaining nanodots.

As it happens, during development of the invention, it was found that the variability of electrical behavior of silicidated nanodots often results from a lack of homogeneity of silicidation phases possible between silicon and metal. It was also found that this lack of homogeneity results from the variation of the ratio of quantity of metal provided to quantity of silicon contained in each of the dots. To control this ratio, the invention discloses a method that reduces the dispersion in particular of the height and therefore of the volume of the nanocrystals before silicidation, as well as the spacing thereof. The dispersion of the size of the nanocrystals is reduced. The quantity of metal to be provided can therefore be precisely determined, and the ratio of quantity of metal provided to quantity of silicon contained in each of the dots is better controlled. The result is dots having improved and more predictable electrical behavior.

In this way the invention makes it possible to improve significantly the performances and reproducibility of devices in which these nanocrystals are integrated.

For example, it permits fine and reproducible control of the trapping of charges in a floating gate. Consequently, it is particularly well adapted to the obtaining of memory cells that permit programming of several information bits.

According to another object of the invention, there is provided a method for obtaining a semiconductor device containing an array of silicidated nanodots produced by employing the method according to any one of the foregoing characteristics.

Another object of the invention is a microelectronic device containing an array of silicidated nanodots produced by employing a method according to any one of the foregoing characteristics. Advantageously, the device obtained by this method is a field-effect transistor of the metal oxide semiconductor type (MOSFET) comprising a floating gate containing the array of nanodots.

Another object of the invention is a non-volatile memory comprising a plurality of transistors according to the foregoing characteristic.

Within the scope of the invention, a microelectronic device of the metal oxide semiconductor field effect transistor type (MOSFET) is provided, comprising a floating gate integrating an array of nanodots, characterized in that the nanodots are silicidated. Preferably the floating gate is situated over the tunnel oxide of the transistor. Preferably the nanodots are separated from the layer forming the conduction channel by a single insulating layer. This insulating layer preferably forms the tunnel oxide.

In the context of development of the invention, it turned out that the metallic dots used in the floating gates of transistors are quite often degraded by the subsequent steps of finalization of the device, such as a transistor, in which these dots are integrated. These subsequent steps involve elevated temperatures, which may modify the electrical behavior and even the structure of certain dots. The invention provides for the obtaining of silicidated dots; these dots therefore are not exclusively metallic. It was found that their behavior is much less sensitive to temperature elevations than is that of purely metallic dots. The behavior of the dots obtained according to the invention therefore remains stable. The method according to the invention therefore makes it possible to improve control of the behavior of nanodots, thus augmenting the performances of MOSFET transistors in which nanodots are integrated.

Another object of the invention is a non-volatile memory comprising a plurality of transistors according to the invention.

The objectives, objects as well as the characteristics and advantages of the invention will become clearer from the detailed description of an embodiment of the invention, which is illustrated by the following attached drawings, wherein:

FIG. 1 shows, in section, an example of the structure of a MOSFET transistor used for construction of non-volatile memory cells and including a floating gate made of silicidated nanocrystals.

Figure 2A:
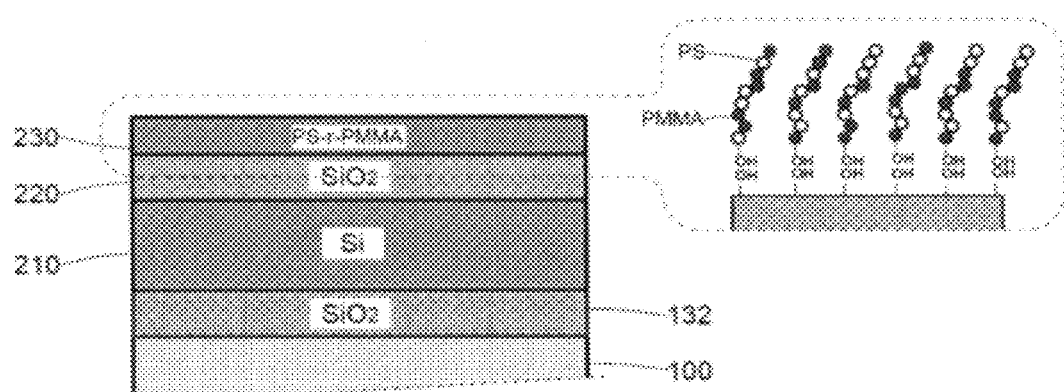
Figure 2B:
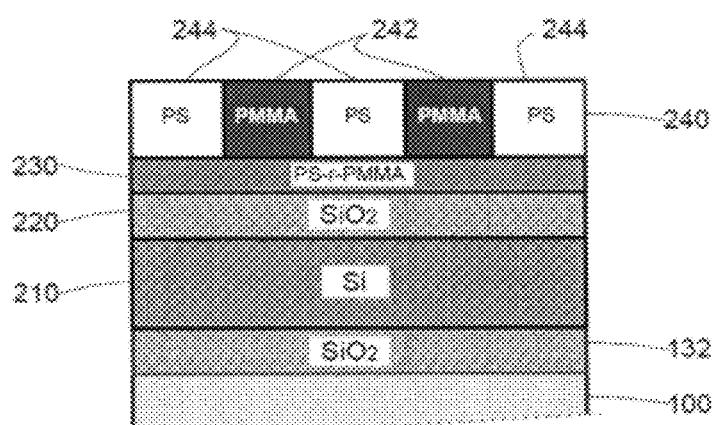
Figure 2C:
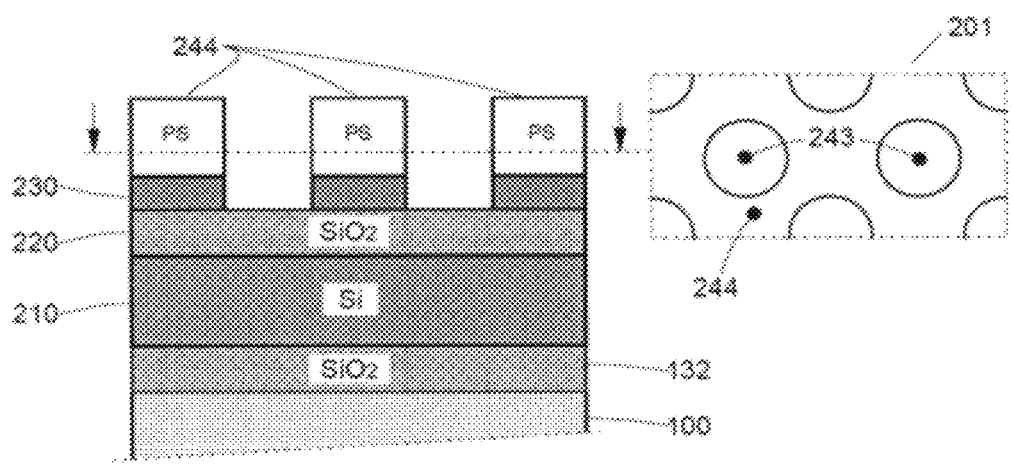

FIG. 2, which comprises FIGS. 2a, 2b and 2c, describes the part of the process according to the invention in which the dots of nanometric size are defined from a material capable of self-organizing.

FIG. 3 comprises FIGS. 3a to 3d, which describe the steps of the process in which the silicon dots are formed.

Figure 4:
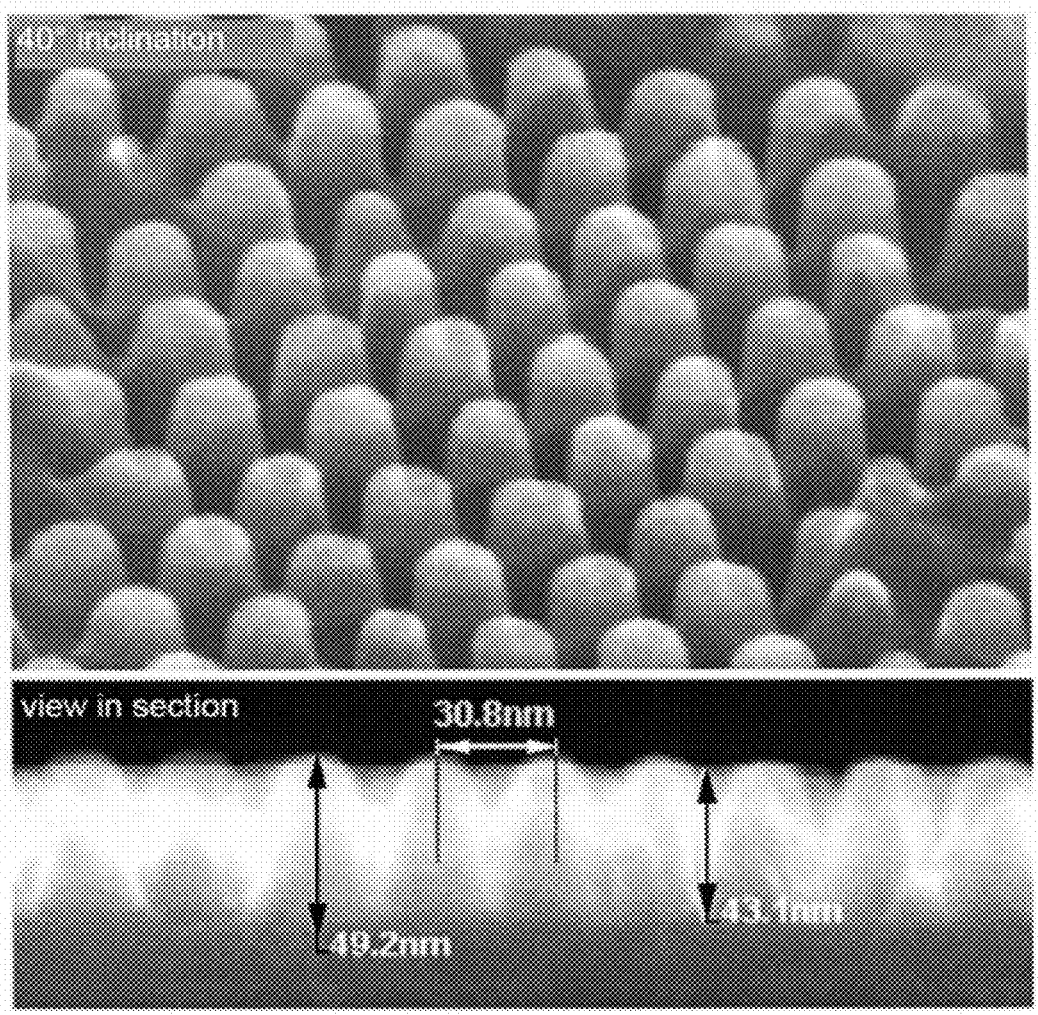

FIG. 4 shows a photo, taken by means of a scanning electron microscope, of an array of dots of nanometric size produced with the process of the invention.

Figure 5A:
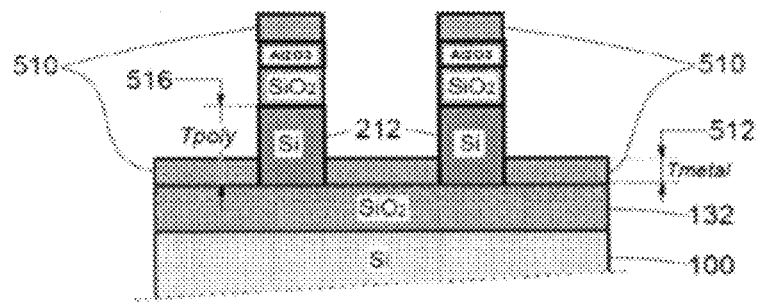
Figure 5B:
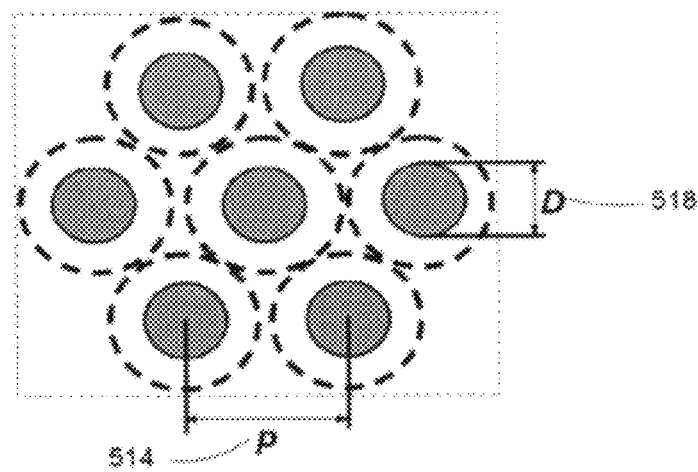
Figure 5C:
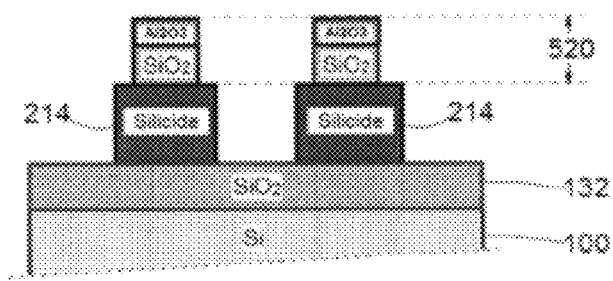

FIG. 5 comprises FIGS. 5a to 5c, which describe the steps of the process in which silicidation of the silicon dots is achieved, The attached drawings are given by way of examples and are not limitative of the invention.

DETAILED DESCRIPTION OF THE INVENTION

Before a detailed description of the invention is presented, it is recalled that it describes a method for obtaining an array of nanodots for microelectronic devices comprising the following steps: deposition of a silicon layer on a substrate; formation, above the silicon layer, of a layer of a material capable of self-organizing, in the interior of which at least one polymer substantially forms cylinders organized into an array within a matrix; formation of patterns in the layer of a material capable of self-organizing by elimination of the said cylinders; formation of a mask by transfer of the said patterns; production of silicon dots in the silicon layer by engraving with the mask; silicidation of the silicon dots, comprising deposition of a metal layer.

Optionally, the invention may additionally comprise at least any one of the following optional characteristics:

Preferably, the silicon layer is a layer of polycrystalline silicon. Alternatively, the silicon layer is a layer of amorphous or monocrystalline silicon.

The metal thickness is determined according to at least the volume of the said nanodots, in such a way as to assure complete silicidation of each of the dots.

The substrate comprises silicon dioxide, at least at its surface. Preferably, the substrate comprises a base substrate topped by a layer of silicon dioxide. Preferably, the base substrate is silicon. More generally, the base substrate is composed of a semiconductor material.

The layer of a material capable of self-organizing is a layer comprising copolymers capable of self-organizing into a plane hexagonal array of cylinders of substantially circular or polygonal section in a matrix. Advantageously, this structure makes it possible to obtain good homogeneity of behavior of the dots. Preferably, the cylinders extend substantially vertically. Preferably they extend over the entire thickness of the layer of a material capable of self-organizing.

The layer of a material capable of self-organizing is a layer comprising a diblock copolymer, one polymer of which forms the said cylinders and the other of the polymers forms the matrix.

Advantageously, the layer of a material capable of self-organizing is a layer comprising one of the following: polystyrene-polymethyl methacrylate (PS-PMMA), polystyrene-polyvinylpyridine (PS-PVP), polystyrene-polyethylene oxide (PS-PEO). Preferably, the layer of a material capable of self-organizing is a layer comprising PS-PMMA (polystyrene-polymethyl methacrylate) forming cylinders of PMMA (polymethyl methacrylate) in a matrix of PS (polystyrene), in which layer the step of formation of patterns comprises the selective elimination of the PMMA cylinders relative to the matrix of PS (polystyrene).

The mask is a hard mask. Hard mask denotes a mask resistant to engraving, typically to plasma engraving. A hard mask partly covers at least the underlying layers. Thus it protects the zones belonging to the layers covered by the mask and situated in line with the mask from engraving. The zones not covered by the mask can be engraved.

Preferably, the formation of the hard mask is achieved by a step of deposition of a masking layer at least in the patterns of the layer in a material capable of self-organizing and by a step of removal, from the patterns, of the material capable of self-organizing.

The masking layer is a layer resistant to a step of engraving so as to protect layers underlying the masking layer from engraving and to transfer the patterns of the hard mask into these underlying layers.

Preferably, the masking layer is a layer selected from among: a layer of alumina, a layer of silicon dioxide (SiO2), a layer of silicon nitride (Si3N4), a layer of amorphous carbon.

Optionally, the step of formation of the hard mask comprises a step of application of a masking layer by deposition of atomic layers. For example, the step of formation of the hard mask is carried out so that the hard mask has a thickness of approximately 5 nanometers.

According to an advantageous variant, the step of removal of the material capable of self-organizing comprises a step of raising, commonly denoted by its English word lift-off.

Preferably, prior to the formation of the layer of a material capable of self-organizing, the process comprises a step of formation of a neutralization layer of a statistical copolymer. The step of obtaining of patterns in the layer of a material capable of self-organizing also leads to obtaining the said patterns in the neutralization layer. In addition, the lift-off step comprises a first step of lift-off by engraving of the material capable of self-organizing and of the neutralization layer, and a second step of lift-off consisting in lifting the masking layer. This second step of lift-off is brought about by the first step of lift-off. Preferably, the engraving is accomplished by plasma engraving.

According to an advantageous embodiment, the statistical copolymer is polystyrene-r-polymethyl methacrylate (PS-r-PMMA).

Preferably, the method comprises, prior to the formation of a layer of a material capable of self-organizing, a step of formation of a layer of silicon dioxide (SiO2) covering the silicon layer.

The metal layer is constituted at least partly of a material selected from among: platinum, nickel, titanium (Ti), vanadium (V), chromium (Cr), manganese (Mn), iron (Fe), cobalt (Co), molybdenum (Mo), palladium (Pd), tantalum (Ta), tungsten (W).

According to preferred embodiments, the metal layer comprises platinum or nickel, at least partly. Preferably, the metal layer comprises only platinum or nickel. Platinum (Pt) and/or nickel (Ni) each has at least two possible silicidation phases. The thickness of the deposited metal layer is calculated to ensure that silicidation of the dots is complete in only one of the possible silicidation phases.

According to one embodiment, the metal deposit is a non-conformed deposit obtained by physical vapor deposition (PVD). According to another embodiment, the metal deposit is a conformed deposit obtained by chemical vapor deposition (CVD).

Advantageously, the thickness of the metal layer is calculated according to the conformity or otherwise of the metal deposit and of the structure of the array of dots obtained by self-organization: shape of the dots, arrangement, size, height and spacing.

According to one embodiment, the metal remaining after silicidation in the PtSi or NiSi phase is dissolved with aqua regia.

FIG. 1 shows, in section, an example of the structure of a MOSFET transistor used for construction of non-volatile memory cells and including a floating gate made of nanocrystals, also referred to as nanodots.

In this traditional MOSFET transistor structure, source 110 and drain 120 are symmetric. Here they are constituted of N-type doped zones in a base substrate or a P-type upper layer 100 of a more complex semiconductor device of the class of those produced by the microelectronics industry: processors, specialized integrated circuits, etc.

The oxide zone of the metal oxide semiconductor structure is constituted by layers 130 formed between control gate 140 of metallic character and semiconductor base substrate 100. That comprises control dielectric 136 including dots of nanometric size: nanocrystals 134, which constitute the floating gate, and fine underlying layer 136 forming the so-called tunnel oxide layer 132.

There also is noted the presence of spacers 150, made of silicon dioxide or nitride, which serve for self-alignment of the zones of metallic character constituting control gate 140, already mentioned, and for forming the electrical contacts, not illustrated, on the source and drain electrodes of the transistor. The application of a voltage higher than the conduction threshold between control gate 140 and source 110 creates a conduction channel 102 on the surface of base substrate 100, between source and drain. Electrons trapped in nanocrystals of floating gate 134 during a phase of programming of the memory cell may increase the conduction threshold beyond the voltage applied during reading. The transistor then remains non-conducting, thus permitting the programming and storage of at least two states, or in other words one information bit.

As described hereinafter, the method according to the invention permits the formation of dots 134 of very well controlled size and volume, making it possible to enlarge the programming window and to define more than one conduction threshold reproducibly and with less dispersion. It is then possible to program more states. For example four, and in general $2^n$ states, making it possible to store two or even more information bits in the same transistor.

FIG. 2, which comprises FIGS. 2a, 2b and 2c, describes the part of the process according to the invention in which the dots of nanometric size are defined from a material capable of self-organizing.

In a preferred embodiment of the invention, diblock copolymers are used. A diblock copolymer is a polymer composed of two blocks of different chemical natures connected to one another by a covalent bond. Under the action of temperature, the chains gain mobility and ultimately become segregated in order to minimize the heterogeneous contacts between the segments of different chemical natures. Heat treatment of these thin layers therefore makes it possible to create structures that are perfectly organized into a lamellar two-dimensional or centered cubic array, for example. The length of the copolymer chains controls the size and spacing of the spontaneously forming micro-domains. The thickness of the layer, the annealing temperature and duration act on the quality of organization in the interior of the film. Numerous types of copolymers exist, such as: PS-PMMA (polystyrene-polymethyl methacrylate), PS-PVP (polystyrene-polyvinylpyridine), and PS-PEO (polystyrene-polyethylene oxide). They are part of a family of polymers referred to generally as "block copolymers".

The method according to the invention is aimed at the creation of the nanocrystals themselves and is not limitative of the structure of the semiconductor device on which they are formed. The nanocrystals may have to be formed on the surface of a substrate in which patterns and a stack of layers necessary for production of a particular semiconductor device have already been created. Nevertheless, a preferred application of the method of the invention remains the formation of floating gates of non-volatile memories, such as discussed in the foregoing. In this case, it is tunnel oxide 132, described in FIG. 1, that constitutes the starting point. The underlying layer is then base substrate 100, where conduction channel 102 is formed between the source and drain of the transistors. Nevertheless, in other applications of the invention, and in general, layer 132 is an oxide layer, the method of obtaining of which is not specified by the invention. Typically, it may be deposited on substrate 100 or obtained by thermal growth from it. Together, substrate 100 and oxide layer 132 constitute the starting material for implementation of the invention.

The first step consists in creating, on oxide 132, a layer 210 of a material from which dots 134 of nanometric size must be formed. In general, layer 210 is constituted of silicon, which may be amorphous, polycrystalline or monocrystalline. The invention also does not specify the method of obtaining this layer. In the case of application of the invention to the production of floating gates of non-volatile memories, layer 210 may be constituted, for example, of polycrystalline silicon deposited on oxide layer 132. In this case, metallic nanocrystals assure better retention of electrons trapped in each of the discrete sites constituting the floating gate, thus permitting multi-level storage, with the advantages discussed in the foregoing relative to the integration density of the memories. Effectively, the metallic nanocrystals have a large output work, making it possible for the electrons to be trapped more deeply and resulting in smaller leakage currents across the insulator. In addition, since the metals have a high state density, the metallic nanocrystals are able to store a larger number of charges compared with silicon nanocrystals. The process of the invention, as will be seen hereinafter, produces such nanocrystals of metallic character even by starting from silicon, to which a step of silicidation by means of a metal such as nickel or platinum will be applied once the nanodots have been formed.

Layer 210 is therefore a silicon layer obtained by means of one or other of the deposition means employed by the microelectronics industry and permitting polycrystalline or amorphous silicon to be obtained. It may also be a layer of monocrystalline silicon obtained by transfer from another substrate, such as for obtaining of silicon wafers on insulators, commonly referred to as SOI, from the English "silicon on insulator". In the context of implementation of the invention, regardless of how it is obtained, its thickness is typically between 3 and 100 nm and more particularly between 5 and 60 nm and more particularly between 5 and 40 nm and more particularly between 5 and 20 nm. Preferably, its thickness is 10 nm. A layer 220 of silicon dioxide ($SiO_2$) is then deposited on silicon layer 201. This permits deposition of PS-r-PMMA, constituting layer 230 described hereinafter, which becomes grafted to the Si—OH hydroxyl bonds at the surface of the SiO2. Its thickness is at least 2 nm. Typically, it is also deposited. In general, all the means used by the microelectronics industry to form layers of materials such as silicon and its oxide may be used to obtain the structure described in FIG. 2.

Here it is important to mention that the height of the silicon dots that will ultimately be made in the ensuing steps will depend strictly and solely on only the thickness of silicon layer 210 created in this step. Advantageously, the dispersion of thickness of this layer 210 is negligible over the extent of a substrate. It is on the order of several percent, which contributes to the formation of an array of dots whose individual sizes and volumes exhibit very little dispersion, as will be described in detail hereinafter. As it happens, the size and the volume of the dots are very important factors for the silicidation process, as will be seen with the description of FIG. 5.

At this stage, from which deposition of the copolymer layer will proceed, it must also be pointed out that the energies of interaction of the PMMA and PS relative to the silicon dioxide are not equal. It is therefore necessary to neutralize the surface of oxide layer 220 in order to be able effectively to obtain a copolymer film organized as cylinders perpendicular to the substrate. To achieve this result, it is necessary firstly to undertake a cleaning of CARO type, or in other words by means of a mixture of sulfuric acid $H_2SO_4$ and hydrogen peroxide $H_2O_2$, traditionally in a proportion of 2.5 parts of $H_2SO_4$ per one part of $H_2O_2$. A cleaning which creates Si—OH hydroxyl bonds at the surface of the silicon dioxide (SiO2). As shown in FIG. 2a, a solution of copolymer is then spread by whirl centrifugation, also known as "spin coating", to form a statistical copolymer layer 230 on the surface of the plate where the devices are produced. The product is known as PS-r-PMMA (polystyrene-r-polymethyl methacrylate or polystyrene-random-polymethyl methacrylate), used as neutralization layer and the characteristics of which are: mole fraction=0.59, molecular mass=13100, and polymolecularity index=1.47. It is constituted of a random alternation of PS and PMMA groups. PS-b-PMMA is the diblock copolymer constituted of a block of PMMA (succession of PMMA monomers) and of a block of PS (succession of PS monomers) connected to one another by a covalent bond.

In order to favor anchoring of the random copolymer chains on the surface of the plate, vacuum annealing is carried out for 48 hours or longer at 170° C., or in other words a temperature lower than the degradation temperature of the statistical copolymer. The duration of annealing beyond 48 hours is not critical. The copolymer chains that have not become fixed to the surface of the $SiO_2$ are rinsed in a bath of toluene. After this the surface of the $SiO_2$ is neutralized for the ensuing deposition of Ps-b-PMMA diblock copolymer, the characteristics of which are: mole fraction=0.3, molecular mass=67100, polymolecularity index=1.09. It is spin-coated onto the preceding random copolymer layer 230. As shown in FIG. 2b, annealing at 170° C. under a vacuum of $5 \times 10^{-2}$ mbar (mbar=$10^{-3}$ bar) leads to the formation of a self-organized film 240, which comprises vertical cylinders 242 of PMMA in a matrix 244 of PS.

As shown in FIG. 2c, the ensuing step consists in eliminating one of the copolymers. In the present embodiment, this step consists in eliminating PMMA cylinders 242 selectively relative to PS 244. After having been immersed in a bath of acetic acid for a duration of at least three minutes, the PMMA as well as the exposed parts of underlying random copolymer layer 230 is removed in a plasma of argon and oxygen (Ar/O2). Any type of plasma engraving reactor is suitable for this operation. FIG. 2c also shows a partial plan view 201 of matrix 244 of PS and of cylindrical apertures 243 remaining after removal of the PMMA, forming a honeycomb structure.

FIG. 3 comprises FIGS. 3a to 3d, which describe the steps of the method in which the silicon dots are formed.

The ensuing steps consist in the formation of a hard mask to permit engraving of dots in silicon layer 210 on the basis of remaining matrix 244 of the layer of a material capable of self-organizing, that is, in the present case, remaining polystyrene matrix 244. It is recalled that a hard mask exhibits patterns and that it is conformed to resist engraving of the underlying layer or layers so as to transfer the mask patterns into these layers. This engraving may be chemical, physical or physicochemical.

Figure 3A:
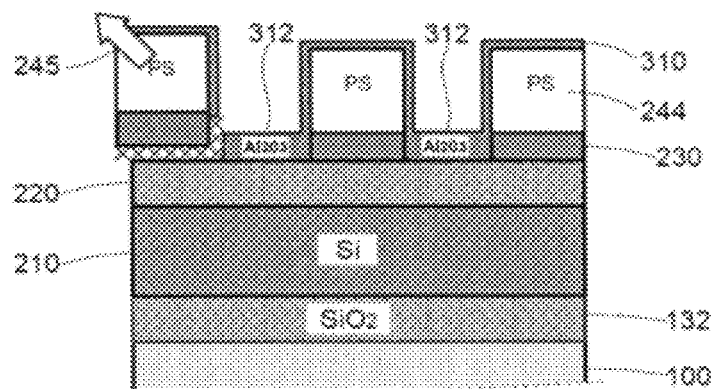

For this purpose, as shown in FIG. 3a, a masking layer 310, typically a layer of alumina or $Al_2O_3$, is then deposited at low temperature, typically at a temperature on the order of 150° C., and in any case at a temperature lower than the melting point of the underlying polystyrene (PS), or 240° C. Deposition is preferably carried out by the so-called ALD technique, from the English "Atomic Layer Deposition" (deposition of a layer of atomic thickness), which makes it possible to deposit, in the gas phase, a layer of atomic thickness in each successive deposition cycle after introduction of two so-called precursor gases. Consequently, the minimum thickness that can be deposited is a single layer, or in other words less than one nanometer. The maximum thickness is limited by the ensuing step of detachment or "lift-off". This step can be achieved only if the thickness of alumina deposited on the polystyrene is sufficiently small. The thickness of layer 310 is several nanometers: typically, up to 5 nm. It will also be noted that, by reason of the low concentration of OH bonds at the surface of the polystyrene, ALD deposition takes place selectively. A delay in nucleation is observed over the polystyrene, with the result that the $Al_2O_3$ deposit is thicker at the bottom of apertures 312, where it is formed on $SiO_2$ layer 220. Apertures 243 left after removal of PMMA cylinders 242, as was seen with the description of FIG. 2c.

The above phenomenon is favorable to implementation of the invention. A small thickness of $Al_2O_3$ is deposited, especially on the flanks of the PS, advantageously making it possible to achieve "lift-off" 245 or raising from the underlying PS and its removal at the same time as PS-r-PMMA layer 230, by means of dry engraving in a plasma, or in other words by bombardment by means of an ionized gas, oxygen in this case. Lift-off in solution is also possible. The specimen is then immersed in a bath of polystyrene solvent, such as acetone or toluene.

In general, the alumina of layer 310 may be replaced by any material capable of being deposited at a temperature lower than the melting point of polystyrene, or 240° C., and exhibiting good engraving selectivity with respect to silicon.

Figure 3B:
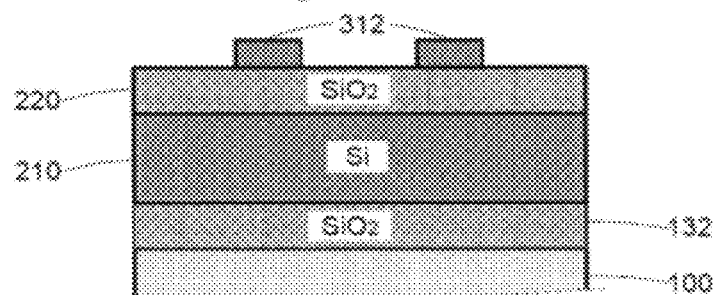

After this operation, in which direct transfer of self-organized patterns is obtained without alteration of the precision of their definition by any other intermediate steps, only an array of cylindrical alumina patterns 312 of nanometric size remains. This result is shown in FIG. 3b. The array of cylindrical alumina patterns forms a hard mask for the ensuing engraving operations, in other words for the engraving of underlying silicon layer 210 in particular. In fact, alumina is known to be an excellent hard engraving mask with high selectivity with respect to silicon. Other materials could be used to form the hard mask, such as, for example, silicon dioxide ($SiO_2$), silicon nitride ($Si_3N_4$) or amorphous carbon.

Figure 3C:
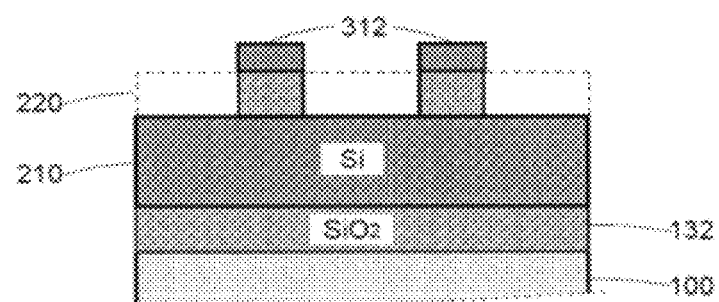

As shown in FIG. 3c, $CF_4$-base engraving chemistry (fluoride plasma) is initially used, however, to engrave upper layer 220 of silicon dioxide.

Figure 3D:
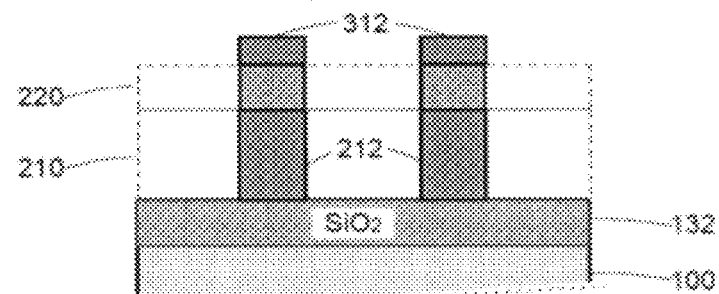

Then, as shown in FIG. 3d, plasma chemistry based either on $SF_6$, $CH_2F_2$, He—$O_2$ (fluoride plasma) or on HBr, $Cl_2$, Ar (bromine and chlorine base plasma) is employed to engrave the silicon layer. These two types of chemistries are very suitable for engraving the polycrystalline silicon gates of MOSFET transistors.

The foregoing engraving is stopped at a stop layer. In the present example, this is oxide layer 132, which constitutes the tunnel oxide layer in the case in which the process is used for formation of floating gates, as was seen in the foregoing. Any layer capable of selective engraving relative to the chemistry of engraving of silicon is suitable. In this way an array of nanodots 212 of silicon having a small dispersion of area, spacing and height is obtained, as can be observed in section and at an inclination of 40° in the photo of FIG. 4, taken by means of a scanning electron microscope. Typically, nanodots, also referred to as nanodots, are structures with heights between several tens of nanometers and several nanometers. For example, these dots have substantially circular or polygonal cross section and are between 3 and 100 nanometers and more particularly between 5 and 60 nanometers and more particularly between 5 and 40 nanometers and more particularly between 5 and 20 nanometers.

The dispersion of area and spacing is entirely controlled by the process of formation of the self-organized array from a copolymer such as PS-PMMA. The dispersion is very narrow. A standard deviation on the order of 2 nm is observed. Furthermore, by providing transfer of patterns 243 into a hard mask for subsequently engraving layer 210 for formation of dots 212, the invention ensures that the dispersion of height depends only on the height of this same layer 210 for formation of dots. The causes of dispersion of height are therefore significantly limited. In addition, the step of deposition of this layer 210 can be precisely controlled. Consequently, control of the height of the dots is improved.

FIG. 5 comprises FIGS. 5a to 5c, which describe the steps of the method in which silicidation of the silicon dots is achieved.

At the end of application of the steps described in the foregoing figures, silicon dots with very narrow dispersion of area, spacing and height and therefore of volume are obtained, as will be seen hereinafter. Since the quantity of silicon is controlled, it is then possible precisely to adjust the quantity of metal that must be provided to attain the desired silicidation phase. The relations existing between the thicknesses of metal deposited, silicon consumed and silicide formed must be known for that purpose. The two metals chosen as the example of implementation of the invention are platinum (Pt) and nickel (Ni), the volume changes of which in the case of a continuous layer are known and listed in the table hereinafter. The right column of this table indicates whether or not selective removal of the excess metal after silicidation is possible, or in other words whether or not a known engraving chemistry exists making it possible to remove the metal without attacking the silicide. Platinum and nickel are mentioned by way of examples; all metal silicides are suitable, including those formed with the metals corresponding to the following chemical symbols: Ti, V, Cr, Mn, Fe, Co, Mo, Pd, Ta and W.

| Metal Volume | Silicon Volume | Silicide phase Volume | Selective removal of the metal/silicide |
|---|---|---|---|
| Ni 1 | Si 1.84 | NiSi 2.2 | Yes |
| Ni 1 | Si 0.9 | Ni$_2$Si 1.5 | Yes |
| Pt 1 | Si 1.3 | PtSi 2 | Yes |
| Pt 1 | Si 0.66 | Pt$_2$Si 1.51 | No |

Before deposition of metal, the nanodots are cleaned in order to remove the native oxygen and the polymers remaining after dry engraving, which would be a barrier to silicidation. The quantity of metal to be deposited on the dots must therefore be proportional to the volume of the silicon dots in a ratio mentioned in the above table. As shown in FIG. 5a, metal deposit 510 is preferably not conformed. This means that the deposit is applied not at all or only slightly on the flanks of the engravings. To accomplish this, a technique of the type known as PVD, from the English "Physical Vapor Deposition", or in other words physical deposition in the vapor phase, is used. This term covers a variety of techniques of deposition of thin films under vacuum by simple thermal evaporation of a source, or by cathodic spraying, also known as "sputtering".

As shown in FIG. 5b, the metal that is useful for silicidation is a ring of diameter p corresponding to the repetition period 514 of a hexagonal array of dots. In fact, when the composition of the copolymer becomes asymmetric, or in other words for PMMA/(PMMA+PS) volume fractions smaller than 0.5, it becomes energetically favorable for the interface between the PMMA and PS to be curved. That produces a hexagonal array. The advantage of this type of array is its compactness: it is the hexagonal array that gives a maximum dot density for a given dot diameter. As shown in FIG. 5a, the thickness of deposited metal 512 is denoted by Tmetal. As mentioned hereinabove, in the case of a non-conformed deposit, there is practically no deposit on the flanks of silicon dots 212. The metal thickness to be deposited is therefore given by the following formula:

$$Tmetal = \frac{Tpoly \pi \left(\frac{D}{2}\right)^2}{\pi \left(\frac{p}{2}\right)^2 - \pi \left(\frac{D}{2}\right)^2} \alpha_{poly/metal}$$

It will be noted that the term $\alpha_{poly/metal}$ corresponds to the ratio of silicon volume to metal volume necessary to obtain the targeted silicide phase in conformity with the foregoing table. For example, to obtain NiSi, $\alpha_{poly/metal}$=1/1.84=0.54.

In the above formula, Tpoly 516 is the height of the silicon nanodots, p is, as already seen, the period 514 of the hexagonal array of the nanodots, and D is the diameter 518 of the nanodots. Thus it is possible to calculate the thickness of metal to be deposited from knowledge of the width and height of the silicon dots. The values obtained in the case of PtSi and NiSi with D=20 nm, p=40 nm and Tpoly=15 nm are listed in the table below.

| | targeted phase | | | |
|---|---|---|---|---|
| | PtSi | Pt$_2$Si | NiSi | Ni$_2$Si |
| Metal thickness to be deposited (for a thickness Tpoly = 15 nm) | 3.8 nm | 7.6 nm | 2.7 nm | 5.6 nm |

In the case of a conformed metal deposit of CVD type, from the English "Chemical Vapor Deposition", or in other words chemical deposition in the vapor phase, a technique using different types of chemical reactions in a deposition chamber, the entirety of the flanks of the silicon dots is then covered with metal. In this case, which is not illustrated in FIG. 5, it is necessary to use a different method for calculating the thickness to be deposited. A calculation method easily derived from the foregoing method by the person skilled in the part.

Once the metal has been deposited by PVD or by CVD, silicidation annealing under vacuum is performed. In the case of platinum and nickel, annealing at 400° C. for approximately one minute under vacuum is sufficient to establish silicidation equilibrium, or in other words the point at which total consumption of one of the two reacting species: the silicon or the metal, has been reached.

More precisely, the following table indicates some examples of alloyed phases (silicide) formed between a metal and the silicon, together with the temperature of formation of the silicide and its resistivity value.

| Element (A) | Silicide (A-Si) | Temperature of formation (° C.) | Resistivity ($10^{-6}$ ohm · cm) |
|---|---|---|---|
| Ti | TiSi | 500 | 63 ± 6 |
|  | TiSi$_2$ | 600 | 10-25 |
| V | VSi$_2$ | 600 | 50-55 |
| Cr | CrSi$_2$ | 450 | >250-1420 |
| Mn | MnSi | 400-500 | 200-260 |
|  | MnSi$_2$ | 800 | 6500-13000 |
| Fe | FeSi | 450-550 | 260-290 |
|  | FeSi$_2$ | 550 | — |
| Co | Co$_2$Si | 350-500 | 60-130 |
|  | CoSi | 375-500 | 90-170 |
|  | CoSi$_2$ | 550 | 18-65 |
| Ni | Ni$_2$Si | 200-350 | 20-25 |
|  | NiSi | 350-750 | 14-50 |
|  | NiSi$_2$ | ≥750 | 34-60 |
| Mo | MoSi$_2$ | 525 | 21-200 |
| Pd | Pd$_2$Si | 100-300 | 25-35 |
|  | PdSi | 850 | — |
| Ta | TaSi$_2$ | 650 | 8.5-55 |
| W | WSi$_2$ | 650 | 50-200 |
| Pt | Pt$_2$Si | 200-500 | — |
|  | PtSi | 300 | 28-40 |

Metal that has not reacted completely with the silicon is removed by wet engraving using appropriate selective chemistry. In the case of platinum or nickel, it is preferable to employ aqua regia, the composition of which is: nitric acid HNO3, hydrochloric acid HCl, in a ratio of one volume of HNO3 per two to three volumes of HCl. In this way the result shown in FIG. 5c is obtained, where the silicon dots have been silicided 214 and have therefore increased in volume.

At this point it is appropriate to point out that it is generally simpler and not inconvenient to leave the SiO2 and the Al2O3 520 at the top of dots 214. In particular, within the context of use of the process of the invention for construction of MOS-FET transistors with floating gate as described in FIG. 1, that is not problematic, because the nanocrystals will then be encapsulated in control dielectric 136, itself constituted of SiO2, Si3N4 or metal oxides such as Al2O3 and HfO2.

The formation of nanodots silicided according to the invention highlights the very important advantage for silicidation represented by prior obtaining of dots with very narrow dispersion of volumes and spacings when this process is compared with a traditional embodiment.

If silicon nanocrystals are deposited on an SiO$_2$ surface by means, for example, of a technique known as LPCVD, from the English "Low Pressure Chemical Vapor Deposition", or in other words chemical deposition in the vapor phase at low pressure, it is then possible to deposit a continuous layer, for example of platinum, and to obtain two phases of silicidation of the platinum: PtSi and Pt2Si. The plates are subjected to silicidation annealing in order to attain the PtSi phase. It is very important in this case that the Pt2Si phase not be attained. In fact, any residual layer of platinum between the dots that was not consumed during silicidation is then removed with aqua regia, which is selective with respect to the PtSi phase but not to the Pt2Si phase. Consequently, the nanocrystals of small sizes are attacked during selective removal.

The dispersion of the size and spacing of the nanocrystals obtained by LPCVD therefore makes it difficult or even impossible to control the silicidation. In fact, in order to attain the targeted silicide phase, it is necessary to deposit the quantity of metal that is just necessary. A just necessary quantity that depends closely on the volume and spacing of the nanocrystals to be silicidated. Consequently, because of these dispersions, the silicide formed in the nanocrystals will not always be identical.

In other words, for an arbitrary metal denoted by Me, possessing two silicidation phases Me2Si and MeSi, if the quantity of metal deposited is adjusted according to the mean size and spacings, the nanocrystals with size smaller than the mean size will be constituted of Me2Si (excess of metal), while the nanocrystals of size larger than the mean will have a non-silicidated core and a shell of MSi (excess of silicon). As it happens, the different silicide phases do not have the same electrical characteristics; in particular, their output work may differ substantially and cause considerable variability of the electrical parameters of the devices containing these nanocrystals, in addition to the variability due to the physical size of the nanocrystals.

By improving in particular the control of the volume of the nanodots, the present invention therefore makes it possible significantly to enhance the performances and the reproducibility of devices in which nanocrystals are integrated.

The invention is not limited to the described embodiments but extends to any embodiment in conformity with the spirit thereof.

The invention claimed is:

1. A process for obtaining an array of nanodots for microelectronic devices, comprising the following steps:
   deposition of a silicon layer on a substrate;
   formation, above the silicon layer, of a layer of a material capable of self-organizing, in which at least one polymer substantially forms cylinders organized into an array within a matrix;
   formation of patterns in the layer of material capable of self-organizing by elimination of the cylinders;
   formation of a hard mask by transfer of the patterns;
   obtaining of silicon dots in the silicon layer by engraving with the hard mask; and
   silicidation of the silicon dots, comprising deposition of a metal layer.

2. The process according to claim 1, wherein the substrate comprises a base substrate topped by a layer of silicon dioxide.

3. The process according to claim 1, wherein the layer of material capable of self-organizing is a layer comprising copolymers capable of self-organizing into a plane hexagonal array of cylinders of substantially circular or polygonal section in a matrix.

4. The process according to claim 1, wherein the layer of material capable of self-organizing is a layer comprising one of the following: polystyrene-polymethyl methacrylate (PS-PMMA), polystyrene-polyvinylpyridine (PS-PVP), or polystyrene-polyethylene oxide (PS-PEO).

5. The process according to claim 1, wherein the layer of material capable of self-organizing is a layer comprising polystyrene-polymethyl methacrylate (PS-PMMA) forming cylinders of polymethyl methacrylate (PMMA) in a matrix of polystyrene (PS), and wherein the step of formation of patterns comprises the selective elimination of the PMMA cylinders relative to the matrix of polystyrene (PS).

6. The process according to claim 1, wherein the formation of the hard mask is achieved by a step of deposition of a masking layer at least in the patterns of the layer of material capable of self-organizing and by a step of removal, from the patterns, of the material capable of self-organizing.

7. The process according to claim 6, wherein the masking layer is a layer resistant to a step of engraving so as to protect the layers underlying the masking layer from engraving and to transfer the patterns of the hard mask into these underlying layers.

8. The process according to claim 6, wherein the masking layer is a layer selected from among: a layer of alumina, a layer of silicon dioxide (SiO2), a layer of silicon nitride (Si3N4), and a layer of amorphous carbon.

9. The process according to claim 6, wherein the step of formation of the hard mask comprises a step of application of a masking layer by deposition of atomic layers.

10. The process according to claim 6, wherein the step of formation of the hard mask is carried out so that the hard mask has a thickness of approximately 5 nanometers.

11. The process according to claim 6, wherein the step of removal of the material capable of self-organizing comprises a step of lift-off.

12. The process according to claim 11, comprising, prior to the formation of layer of a material capable of self-organizing, a step of formation of a neutralization layer of a statistical copolymer, wherein the step of formation of patterns in the layer of material capable of self-organizing also leads to formation of the patterns in the neutralization layer, and wherein the lift-off step comprises the lift-off by engraving of the layer of a material capable of self-organizing and of the neutralization layer, leading to lift-off of the masking layer.

13. The process according to claim 12, wherein the statistical copolymer is polystyrene-r-polymethyl methacrylate (PS-r-PMMA).

14. The process according to claim 1, comprising, prior to the formation of a layer of material capable of self-organizing, a step of formation of a layer of silicon dioxide (SiO2) covering the silicon layer.

15. The process according to claim 1, wherein the metal layer is constituted at least partly of a material selected from among: platinum, nickel, titanium (Ti), vanadium (V), chromium (Cr), manganese (Mn), iron (Fe), cobalt (Co), molybdenum (Mo), palladium (Pd), tantalum (Ta), and tungsten (W).

16. The process according to claim 15, wherein the deposition of the metal layer is a non-conformed deposit obtained by physical vapor deposition (PVD).

17. The process according to claim 15, wherein the deposition of the metal layer is a conformed deposit obtained by chemical vapor deposition (CVD).

18. The process according to claim 1, wherein the metal remaining after silicidation is dissolved with aqua regia.

19. A process for obtaining a field effect transistor comprising at least one floating gate, wherein the floating gate contains an array of nanodots, comprising the following steps:
  deposition of a silicon layer on a substrate comprising at least one layer intended to form a conduction channel for the transistor;
  formation, above the silicon layer, of a layer of a material capable of self-organizing, in which at least one polymer substantially forms cylinders organized into an array within a matrix;
  formation of patterns in the layer of a material capable of self-organizing by elimination of the cylinders;
  formation of a hard mask by transfer of the said patterns;
  obtaining of silicon dots in the silicon layer by engraving with the hard mask; and
  silicidation of the silicon dots, comprising deposition of a metal layer.

20. The process according to claim 1, wherein the array of nanodots is comprised in a floating gate of a field effect transistor.

* * * * *